United States Patent [19]

Hashimoto et al.

[11] Patent Number: 4,999,259

[45] Date of Patent: Mar. 12, 1991

[54] CHROME-COATED STAINLESS STEEL HAVING GOOD ATMOSPHERIC CORROSION RESISTANCE

[75] Inventors: Misao Hashimoto; Satoshi Ito; Shunpei Miyajima; Wataru Ito, all of Kawasaki; Tadashi Komori, Hikari, all of Japan

[73] Assignee: Nippon Steel Corp., Tokyo, Japan

[21] Appl. No.: 439,232

[22] Filed: Nov. 17, 1989

Related U.S. Application Data

[62] Division of Ser. No. 380,731, Jul. 14, 1989.

[30] Foreign Application Priority Data

Nov. 26, 1986 [JP] Japan ................................ 61-279828

[51] Int. Cl.⁵ .............................................. B32B 15/04
[52] U.S. Cl. ..................................................... 428/685
[58] Field of Search ........................................ 428/685

[56] References Cited

U.S. PATENT DOCUMENTS

| | | | |
|---|---|---|---|
| 2,169,354 | 8/1939 | Chace | 428/685 |
| 2,288,184 | 6/1942 | Dodson | 428/685 |
| 3,971,633 | 7/1976 | Wolfla | 428/685 |
| 4,482,612 | 11/1984 | Kuroki | 428/685 |

*Primary Examiner*—Peter D. Rosenberg
*Attorney, Agent, or Firm*—Kenyon & Kenyon

[57] ABSTRACT

Chrome-coated stainless steel is provided that has better adhesion, even when it is being shaped, than conventional wet-type plating, and better atmospheric corrosion resistance than bare stainless steel. In addition, the chrome-coated stainless steel, provided by means of physical vapor deposition, also possesses the same color tone and luster as chromium, and thus has superior decorative compatibility with existing wet-type chrome plated parts.

4 Claims, No Drawings

CHROME-COATED STAINLESS STEEL HAVING GOOD ATMOSPHERIC CORROSION RESISTANCE

This is a division of application Ser. No. 07/380,731 filed July 14, 1989.

BACKGROUND OF THE INVENTION

1. Field of the Invention

This invention relates to stainless steel having good workability and atmospheric corrosion resistance that is provided with a highly-adhesive chrome coating applied to the surface thereof by means of physical vapor deposition (PVD) and which also has good decorative compatibility with wet-type chromium plating.

2. Description of the Prior Art

Stainless steel has long been used extensively as a corrosion-resistant material that can be used as is, without any surface treatment. However, use in a severe environment, such as a coastal area, leads to staining and the formation of red rust on the surface of the stainless steel which results in a loss of the superb surface appearance that has always been a reason for selecting stainless steel.

It is desirable that stainless steel materials, especially those for exterior use, be capable of retaining their superb surface appearance indefinitely and that the surface quality be protected for a long period of time. From this viewpoint, it is necessary to improve the atmospheric corrosion resistance of the stainless steel.

Increasing the chromium component or adding elements such as nickel or molybdenum in order to increase the corrosion-resistance of the stainless steel itself has been employed and various highly corrosion-resistant stainless steels have been developed. However, the above methods have had the drawbacks that they increase the manufacturing costs and it is difficult to ensure the requisite tensile strength and toughness.

It is well known that chromium is an element that plays a fundamental role in the high corrosion-resistance of stainless steel. The corrosion-resistance is further improved by a method that involves chrome-plating the surface of the stainless steel by means of a wet-type process. However, inasmuch as the stainless steel surface is thus covered with a passive film providing the surface with the said corrosion-resistance, there have been problems involving the difficulty of applying the chrome plating and the adherence and uniformity thereof. Because of this, pretreatment has been employed such as cathodic electrolysis or pickling in an acid solution immediately prior to the plating. Also, in order to prevent passivation of the stainless steel surface and increase the adhesion by absorbing, in whatever degree, deformation of the plated chrome, a lamination method has been put forward in Japanese Patent Publication No. 50(1975)-35010 consisting of the deposition of a thin film of copper on the surface in an acid solution containing copper ions, followed by a layer of nickel and a layer of chrome.

However, because in each of the aforementioned wet-type plating methods the stainless steel is pickled in the plating solution, i.e. an aqueous solution, perfect prevention of passivation of the stainless steel is difficult, so that no matter how much effort is expended additional processing is still required, causing a problem that peeling readily occurs. Stainless steel used for building materials, kitchen equipment and the like may, when the work is being executed, be extensively shaped at edge portions or joints of roofs, window frames and the like. When the processes in which stainless steel may be used in practice are considered, an essential condition is that it possess excellent adhesion that will not give rise to peeling of the chrome film even when the stainless steel is shaped. Also, with wet-type chrome plating, degradation of the plating solution occurs during the plating process. As a consequence, impurities in the plating solution can become entrained in the chrome film, leading to deterioration in the performance of the chrome film.

With stainless steel now being used more extensively for kitchen equipment and piping around toilets and the like, decorative compatibility with the existing wet-type chrome plating has become required. This means that it is desired that the stainless steel surface color tone and luster be identical with those of chrome plating.

SUMMARY OF THE INVENTION

An object of the present invention is to provide a method of manufacturing stainless steel having good workability and atmospheric corrosion resistance that is provided with a highly-adhesive chrome coating applied to the surface thereof by means of physical vapor deposition and which also has good decorative compatibility with wet-type chrome plating.

The present invention relates to a chrome-coated stainless steel having good adhesion, workability, atmospheric corrosion resistance and which also has excellent decorative compatibility with wet-type chrome plating, characterized by the use of physical vapor deposition to coat the surface of the stainless steel with chrome coating at a deposition rate of 0.1 to 200 Å/sec, and a coating thickness of 0.01 to 1 micrometers. Moreover, with respect to the stainless steel that is the object of the coating, there is no special limitation on which type is used, and chromitic or nickel-type, or ferritic or austenitic stainless steel may be used.

That is, chrome-coated stainless steel can be developed which is uniform and has excellent atmospheric corrosion resistance, and wherein the stainless steel and chrome film have outstanding adhesion and decorative compatibility with the wet-type chrome plating, by first cleaning the stainless steel surface by ion bombardment or sputter etching in a vacuum in order to eliminate the passive film followed by chrome coating by means of physical vapor deposition (PVD). First, with respect to chrome coating, the results of experiments have shown that compared to the wet-type chrome plating process, the chrome coating according to the present invention has better denseness, and because of this it has more of a corrosion-resistant effect even if it is made thin. Specifically, it is effective in a thickness of 0.01 micrometers and above. It goes without saying that to be sure, the thicker the film is, the better. On the other hand, the thicker it becomes the more readily peeling of the coating occurs owing to stresses on the surface and at the interfaces during bending becoming large. In practice, peeling readily occurs during the forming when the thickness exceeds 1 micrometer. Also, regarding the decorative compatibility with the wet-type chrome plating, it is enough if the surface is uniformly coated with the chrome, and also from this point, a minimum thickness of 0.01 micrometers is required. From the above, preferably the thickness of the coating will be from a minimum of 0.01 to 1 micrometers.

Pretreating the surface prior to the application of the coating is extremely important. The effect of this is large, especially with respect to the adhesion. Available conventional methods to achieve this objective include degreasing, pickling in an acidic solution, and cathodic electrolysis, but cleaning by means of sputter etching and ion bombardment in a vacuum is extremely effective. That is to say, the surface of the said stainless steel has an inactive film, termed a passive film, that is the source of the high corrosion-resistance, and it is because of this that much of the adhesion of wet-type chrome plating is lost. This is also the case with the oxidation film in bright annealing and the like. With wet-type chrome plating using an aqueous solution, it is difficult to provide adhesion because even if, for example, the passive film is removed in the solution, owing to the presence of the water the passive film reforms easily. On the other hand, as the method according to the present invention is carried out in a vacuum from which water as well as air has been removed, if the surface passive film is once removed, it becomes possible to expose the active surface of the stainless steel substrate. This means that it becomes possible to remove the passive film by ion bombardment or sputter etching and then immediately apply the chrome coating.

Ion-bombardment method refers to a method of placing the substrate in plasma and bombarding the substrate surface with electrons, ions, also high-velocity neutral atoms or molecules, contained in the plasma, to thereby clean the surface. Sputter etching refers to a method of reversing the polarity of the vapor deposition target substrate and physically etching the substrate to clean the substrate surface.

For example, radio frequency (RF) ion-bombardment pre-treatment of the substrate at a pressure of $1 \times 10^{-4}$ to $1 \times 10^{-3}$ Torr, and a power of from 200 w to 1000 w for from several minutes to several tens of minutes is sufficient. Also, RF sputter-etching pre-treatment of the substrate at the same range of pressures used for sputtering and a power of from 100 w to 700 w for from several minutes to several tens of minutes is sufficient.

Whichever is used, treatment conditions may be selected suitably in consideration of the state of the substrate surface to be coated.

By means of the aforementioned pretreatment, adhesion may be increased and the good properties of chrome-coated stainless steel exhibited.

The chrome coating can be formed by a PVD method such as sputtering, ion plating, vacuum deposition or the like, but from the viewpoint of adhesion an ion plating method is preferable.

The properties of the chrome coating that is formed are closely related to the operating conditions of the PVD technique as well as the surface pretreatment conditions prior to the coating. Here, PVD is broadly defined as the so-called ion plating, sputtering, and vacuum deposition. In the sputtering method, ions produced by plasma reaction in an inert gas such as argon are used to sputter a chrome target and coat the substrate with chrome. In the ion plating method, the chrome is vaporized and then ionized in plasma to perform the chrome coating.

For the ion plating method, hollow cathode discharge (HCD), electron-beam heating, resistance heating and various other such methods may be used for the heating and vaporization of the source materials for the coating. Also, there are such methods as RF excitation, HCD and thermal electron radiation, bias probe and the like, any of which is effective as the ionization method.

From considerations of productivity, the faster the deposition rate is, the higher the efficiency. However, deposition rate has a direct effect on coating quality. Generally, it is easy for a high deposition rate to lead to a coarse-grained coating which makes it difficult to obtain a coating that is of uniform quality, so that to achieve complete covering it is necessary to apply quite a large coating amount. As a result, workability of the coating deteriorates. Hence, the inventors carried out various experiments in which deposition rate was an important factor and found that in the case of ion plating, vacuum deposition, and sputtering, a good coating of chrome could be obtained at a deposition rate of 0.1 to 200 Å/sec. A rate below 0.1 Å/sec is too slow to be practical in terms of productive efficiency. Also in the case of such a slow rate there may be portions which are not completely coated owing to sputter-etching by the ions. As such, a minimum rate of 0.1 Å/sec is required for a stable, consistent coating. In the case where the deposition rate is less than 0.1 Å/sec, more than 1000 seconds is required to obtain a coating thickness of 0.01 micrometers, and because the coating process is so long gas can be entrapped in the coating film which can readily produce residual stress in the coating film.

On the other hand, as mentioned above, as a deposition rate that is too high can easily result in a coarse-grained coating that will have inferior atmospheric corrosion resistance and bending workability, a rate of 200 Å/sec is the upper limit.

The higher the substrate temperature becomes, the better the adhesion of the coating. However, if the temperature becomes too high, oxygen gas which can easily be entrained as an impurity in the introduced gas may result in slight oxidation of the coating, which may cause loss of adhesion. As such, in the case of ion plating, vacuum deposition, and sputtering, from room temperature to 500° C. is preferable.

In the following, coating methods using ion plating and sputtering will be described in detail.

As already mentioned, with respect to the ion plating method, there are various vaporization and ionization methods, and a coating of good quality can be obtained with any of these methods providing the deposition rate is within the aforementioned range. More preferably, an optimum coating can be obtained at a deposition rate of 0.5 to 50 Å/sec.

A chamber operating pressure in the range $1 \times 10^{-6}$ to $1 \times 10^{-2}$ Torr may be selected. If there is no ionization it will become the same as ordinary vacuum deposition, in which case it will be necessary to maintain a higher vacuum than $1 \times 10^{-6}$ to $1 \times 10^{-5}$ Torr. When ionization is carried out using high-frequency discharge, for example, a pressure of $1 \times 10^{-5}$ to $1 \times 10^{-3}$ Torr is preferable in order to maintain the stability of the discharge. With the HCD method, a pressure of $1 \times 10^{-5}$ to $1 \times 10^{-2}$ Torr is preferable. Intense bombardment of the stainless steel substrate with chrome ions is an effective way of improving adhesion. For this purpose, applying a bias voltage to the substrate is an advantageous method. For the bias voltage, a direct current negative potential is preferable. Applying a direct current negative potential to the substrate has the effect of producing a dramatic increase in adhesion, in addition to which the coating becomes more dense, improving the atmospheric corrosion resistance. With respect also to decorative compatibility with wet-type chrome plating, application of a negative potential to the substrate increases the light reflectivity for good correspondence to the brightness of wet-type chrome plating. However, the intense collision of ions with the substrate produced by the application of a negative potential increases the etching amount, which results in a reduction of the deposition rate. In view of the above, any application of a negative potential is usually up to 500 v.

With respect also to sputtering, while there are various methods the basic principle of each is the same and, provided the deposition rate conforms to the aforementioned conditions, each will enable a good-quality coating film to be obtained. However, a rate of 0.5 to 50 Å/sec is more preferable as a range which satisfies the requirements of atmospheric corrosion resistance, adhesive and decorative compatibility. In the case of the present method, a low operating chamber pressure is better to reduce the entrainment of gas in the coating from the argon or other such inert gas which is introduced into the chamber to generate plasma by discharge, but this pressure should be determined according to the relationship with the stability of the plasma. Usually a range of $1 \times 10^{-5}$ to $1 \times 10^{-3}$ Torr is adequate. With a magnetron-type discharge system, an operating pressure of $1 \times 10^{-5}$ to $1 \times 10^{-2}$ Torr is sufficient. Either direct current or high-frequency discharge can be used for the chrome coating, and the higher the power the higher the deposition rate becomes. This power is however determined in accordance with the aforementioned deposition rate conditions.

In accordance with the aforementioned PVD method, coating is possible wherein chrome coating is uniform and has few defects, such as pinholes, and therefore the corrosion-resistance is outstanding. Such a uniform, dense coating is characterized by the thinness of the coating that can exhibit sufficient corrosion-resistance, the low level of defects such as pinholes and cracks, and the good adhesion to the substrate, as a result of which the chrome coating conforms well to the deformation of the substrate, including during the shaping thereof, so that there is no deterioration of the chrome coating even during the shaping.

EXAMPLE 1

An example is shown of chrome coating of SUS 430 (ferritic stainless steel containing about 18% chrome) stainless steel substrate by means of magnetron RF sputtering. The coating was performed at an operating pressure of $5 \times 10^{-3}$ Torr (argon), an RF Power of 1 kw and a substrate at room-temperature. The deposition rate was within the range of 5 to 10 Å/sec. The thickness of the coating was 0.1 micrometers.

In order to study the effect of the substrate pretreatment, the substrate used was prepared by RF ion bombardment and by sputter-etching (reverse sputtering) for 1 minute, 5 minutes and 20 minutes under the conditions shown in Table 1.

To study the adhesion, chrome-coated stainless steel was cut into 30 mm widths which were given a 2 t (twice the steel thickness) bend in the center portion. The bend portion was then examined by means of a scanning electron microscope to examine the degree of peeling of the chrome coating.

The results are summarized in Table 1. Comparative specimens which were given a coating 0.1 micrometers in thickness using a a conventional wet-type chrome plating method were examined.

The chrome coated stainless steel prepared according to the method of the present invention by ion-bombardment in a vacuum chamber or sputter-etching followed by sputtering showed very little cracking, even during shaping, and exhibited better adhesion than that obtained in the case of wet-type plating.

EXAMPLE 2

This is an example of chrome coating by means of magnetron RF sputtering. As the pretreatment for the substrate SUS 430 stainless steel, RF ion bombardment (which had shown good results in Example 1) at a power of 500 W for 20 minutes was used. The substrate temperature was changed from room temperature to 500° C., the coating thickness from 0.01 to 1 micrometer and the deposition rate from about 0.1 to 200 Å/sec. The deposition rate was changed within the RF Power range of 0.1 to 5 kw; for the low deposition rate, the substrate was rotated in a circle 500 mm in diameter through which the target passed; and for the high deposition rate the substrate was fixed directly above the target. Argon gas was employed and the operating pressure was within the range $1 \times 10^{-4}$ to $9 \times 10^{-3}$ Torr.

Workability was evaluated by forming a 5 t (five times the steel thickness) bend, applying scotch tape to the bend portion, removing the tape quickly and checking to see how much of the chrome coating was adhering to the tape. The atmospheric exposure test was used to evaluate atmospheric corrosion resistance. To simulate a severe environment, the test specimens were sprayed three times a day with a 3.5% solution of salt water. The period of exposure was one week. The results of these tests are shown in Table 2.

In all cases the atmospheric corrosion resistance of the chrome-coated stainless steel was superior to that of the stainless steel that had no chrome coating.

In appearance each of the chrome-coated stainless steels had the attractive color tone and luster of chromium and a far better decorative consistency with wet-type chrome plating than the SUS 430 stainless steel that had no coating.

EXAMPLE 3

This is an example of chrome coating by means of ion plating including vacuum deposition. A substrate of SUS 430 stainless steel was subjected to ion bombardment for 20 minutes following which electron-beam heating was employed to apply the chrome coating. RF excitation was used to generate plasma for ionization; the RF output for this was 500 W. In addition, chrome coating was also carried out under ordinary vacuum deposition conditions, without ionization. The substrate temperature was changed from room temperature to 500° C., the coating thickness from 0.01 to 1 micrometer and the deposition rate in the range of from about 0.1 to 200 Å/sec. The deposition rate was adjusted to a predetermined value by varying the Power of the electron-beam gun and, depending on the case, changing the distance between the substrate and the vaporization source. The operating pressure was in the range $1 \times 10^{-6}$ to $1 \times 10^{-3}$ Torr. In cases where ionization was effected, a bias voltage was varied within the range 0 to 500 v in order to accelerate the ions.

Workability, adhesion and weather resistance were evaluated by the same methods used for Example 2. The results are shown in Table 3.

In all cases characteristics superior to SUS 430 stainless steel that had no coating were exhibited.

Although there was some variation according to the manufacturing conditions used, in appearance each of the chrome-coated stainless steels had the color tone and luster of chromium and a better decorative consistency with wet-type chrome plating than the SUS 430 stainless steels that had no coating.

It has been seen in the foregoing that chrome-coated stainless steel offers better adhesion, also during forming, than conventional wet-type plating, in addition to which it possesses much better atmospheric corrosion resistance than stainless steel that has no coating. As such, it meets the requirements for stainless steel used as building materials and for kitchen equipment and can maintain the aesthetic appeal of its surface for long periods.

Moreover, as the chrome-coated stainless steel according to this invention also possesses the color tone and luster of chromium, it has superior decorative compatibility with wet-type chrome plated parts and can therefore be used with existing wet-type chrome-coated parts used on kitchen equipment and toilet piping and the like.

TABLE 1

| No. | Pretreatment conditions | Power | Time | Coating method | Workability |
|---|---|---|---|---|---|
| 1 | No pretreatment | | | Wet-type plating | X |
| 2 | RF ion bombardment | 500 W | 1 min | Sputtering | Δ |
| 3 | RF ion bombardment | 500 W | 5 min | Sputtering | Δ |
| 4 | RF ion bombardment | 500 W | 20 min | Sputtering | ⊙ |
| 5 | RF ion bombardment | 1000 W | 5 min | Sputtering | ⊙ |
| 6 | RF ion bombardment | 200 W | 20 min | Sputtering | ○ |
| 7 | RF sputter etching | 500 W | 1 min | Sputtering | Δ |
| 8 | RF sputter etching | 500 W | 5 min | Sputtering | ○ |
| 9 | RF sputter etching | 500 W | 20 min | Sputtering | ⊙ |
| 10 | RF sputter etching | 700 W | 1 min | Sputtering | ○ |
| 11 | RF sputter etching | 700 W | 5 min | Sputtering | ⊙ |

Note: Tape peeling evaluation key
⊙ No cracking
○ Very slight cracking
Δ Slight cracking
X Peeling

TABLE 2

| No. | Substrate temperature | Thickness of coating | Deposition rate | Workability (Note 1) | Atmospheric corrosion resistance (Note 2) |
|---|---|---|---|---|---|
| 12 | Room temperature | 0.01 m | 0.1 Å/sec | ○ | Δ |
| 13 | Room temperature | 0.01 m | 1 Å/sec | ⊙ | Δ |
| 14 | Room temperature | 0.1 m | 0.1 Å/sec | ○ | ○ |
| 15 | Room temperature | 0.1 m | 1 Å/sec | ○ | ○ |
| 16 | Room temperature | 0.1 m | 4 Å/sec | ○ | ○ |
| 17 | Room temperature | 0.1 m | 50 Å/sec | ○ | ○ |
| 18 | Room temperature | 1 m | 48 Å/sec | Δ | ⊙ |
| 19 | Room temperature | 1 m | 170 Å/sec | Δ | ⊙ |
| 20 | 200° C. | 0.1 m | 5 Å/sec | ○ | ⊙ |
| 21 | 500° C. | 0.1 m | 7 Å/sec | Δ | ○ |
| 22 | SUS 430 stainless steel (non-coated) | | | — | X |

Note 1: Tape peeling evaluation key
⊙ No peeling
○ Very slight peeling
Δ Slight peeling
X Peeling
Note 2: Atmospheric corrosion resistance evaluation key
⊙ No rust
○ Very slight staining
Δ Slight staining
X Rusting

TABLE 3

| No. | Substrate temperature | Thickness of coating | Deposition rate | Bias voltage | Workability (Note 3) | Atmospheric corrosion resistance (Note 3) |
|---|---|---|---|---|---|---|
| 22 | SUS 430 stainless steel (non-coated) | | | — | — | X |
| 23 | Room temperature | 0.1 m | 6 Å/sec | 0 | ○ | ○ |
| 24 | Room temperature | 0.1 m | 3 Å/sec | 100 V | ⊙ | ⊙ |
| 25 | Room temperature | 0.1 m | 2 Å/sec | 500 V | ⊙ | ⊙ |
| 26 | Room temperature | 0.1 m | 0.5 Å/sec | 100 V | ⊙ | ○ |
| 27 | Room temperature | 0.1 m | 4.2 Å/sec | 100 V | ○ | ○ |
| 28 | Room temperature | 0.1 m | 180 Å/sec | 100 V | Δ | ○ |
| 29 | Room temperature | 0.01 m | 4 Å/sec | 100 V | ⊙ | Δ |
| 30 | Room temperature | 1 m | 4 Å/sec | 100 V | Δ | ⊙ |
| 31 | 100° C. | 0.1 m | 2 Å/sec | 100 V | ⊙ | ⊙ |
| 32 | 500° C. | 0.1 m | 2 Å/sec | 100 V | ⊙ | ⊙ |
| 33 Note 4 | Room temperature | 0.1 m | 5 Å/sec | — | Δ | ○ |

Note 3: For evaluation key, refer to Notes 1 & 2 of Example 2.
Note 4: Chrome coating under ordinary vacuum vapor deposition conditions, without using ionization.

What is claimed is:

1. A chrome coated stainless steel having good adhesion, workability and atmospheric corrosion resistance comprising:

a stainless steel substrate having a surface;

a chrome coating by physical vapor deposition, having a thickness from 0.01 to 1.0 micrometers strongly adhered to said surface;

said chrome coating having an appearance similar to chrome plating conducted in an aqueous electrolyte.

2. A chrome coated stainless steel according to claim 1 wherein said physical vapor deposition is selected from the group consisting of vacuum deposition, sputtering and ion-plating.

3. A chrome coated stainless steel according to claim 1 wherein said adherence is characterized by very little cracking as viewed by a scanning electron microscope in a bent in said substrate twice the thickness of said substrate.

4. A chrome coated stainless steel according to claim 1 wherein said adherence is characterized by very little delamination of said chrome coating as evaluated forming a bent in said substrate five times the thickness of said substrate, by applying scotch tape to the bent portion, removing the tape quickly and checking how much coating was adhering to the tape.

* * * * *